United States Patent [19]

Reyling, Jr.

[11] 4,233,670

[45] Nov. 11, 1980

[54] FAULT TRANSPARENT MAGNETIC BUBBLE MEMORY

[75] Inventor: George F. Reyling, Jr., Sunnyvale, Calif.

[73] Assignee: National Semiconductor Corporation, Santa Clara, Calif.

[21] Appl. No.: 968,172

[22] Filed: Dec. 11, 1978

[51] Int. Cl.³ .............................................. G11C 19/08
[52] U.S. Cl. ........................................ 365/15; 365/39
[58] Field of Search ............................ 365/15, 200, 39

[56] References Cited

U.S. PATENT DOCUMENTS

| 3,990,058 | 11/1976 | Archer et al. | 365/15 |
| 4,139,906 | 2/1979 | Chen | 365/15 |

OTHER PUBLICATIONS

Journal of Applied Physics—vol. 48, No. 6, Jun. 1977, pp. 2419-2423.

Primary Examiner—James W. Moffitt
Attorney, Agent, or Firm—Brown & Martin

[57] ABSTRACT

The disclosed fault transparent bubble memory has a plurality of minor loops for storing magnetic bubbles, a serial-parallel input path for writing bubbles into the minor loops, and a parallel-serial output path for reading bubbles from the minor loops. Between the parallel inputs and parallel outputs of the minor loops lie pairs of bubble propagation elements. Each element propagates the bubbles by a single predetermined distance. Lying between each pair of these propagation elements is a shorting bar. It converts a pair of single distance propagation elements into one double distance propagation element. Defective minor loops are made transparent by selectively destroying those shorting bars that lie between fault-free minor loops. This selective destruction preferably is performed by a laser beam.

9 Claims, 9 Drawing Figures

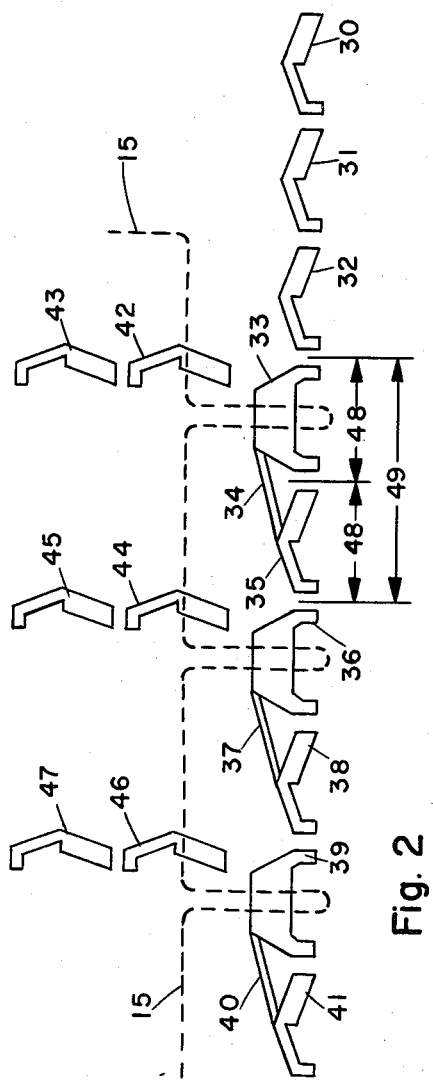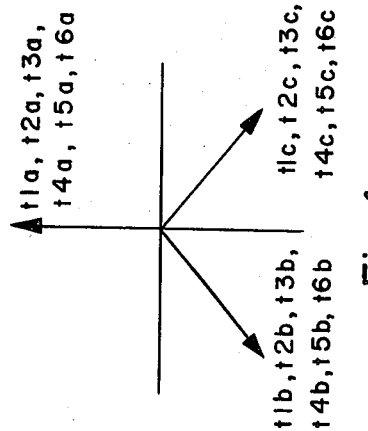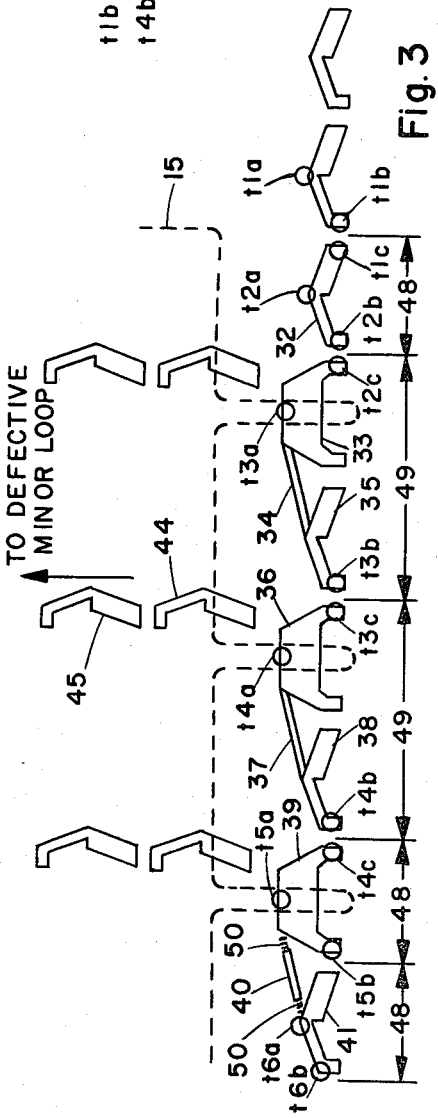

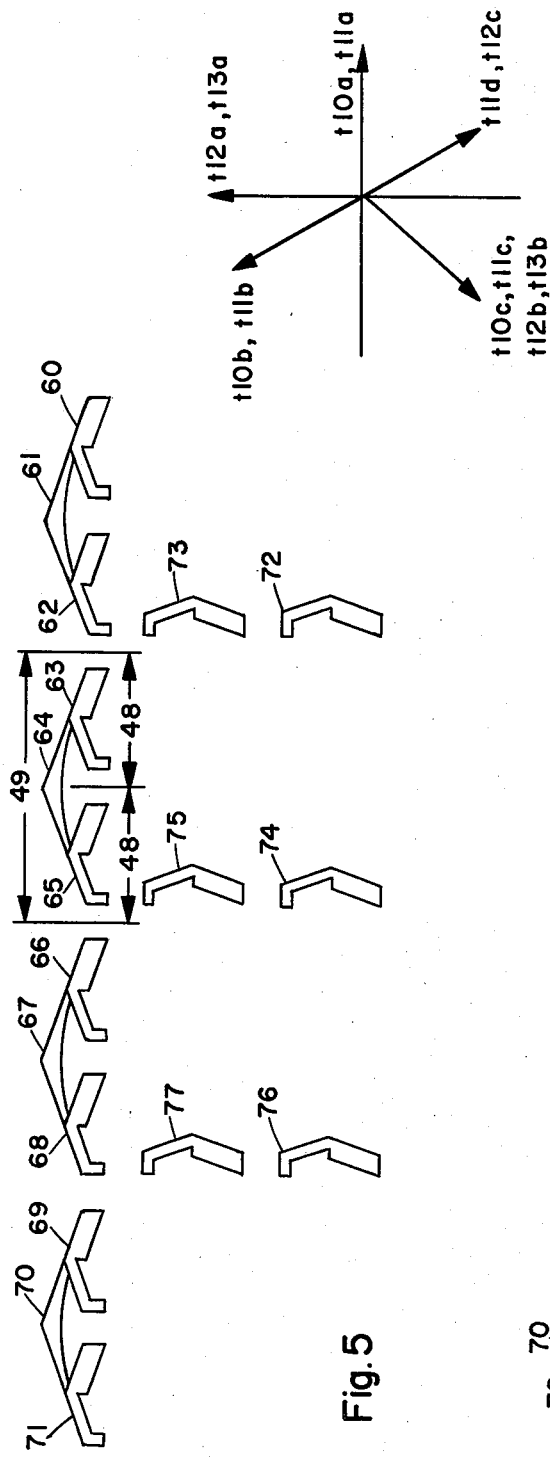
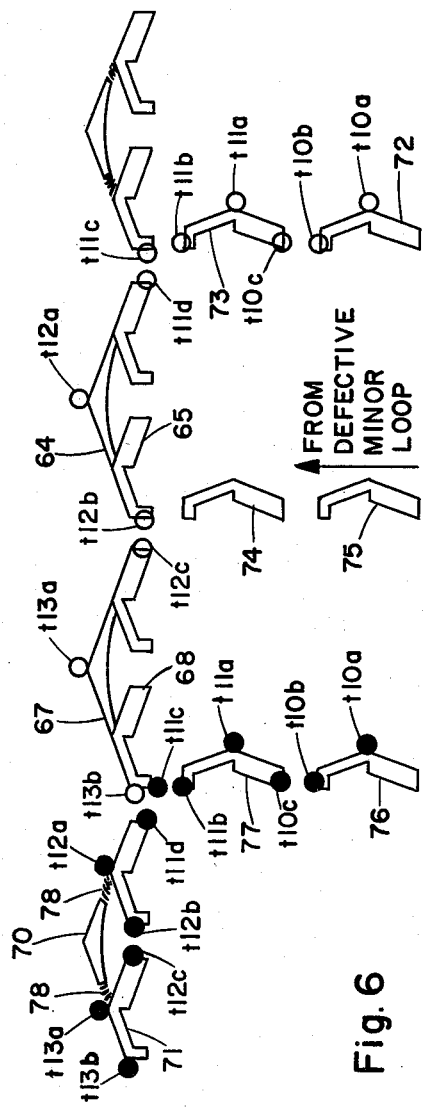
Fig. 5
Fig. 6
Fig. 7

4,233,670

FAULT TRANSPARENT MAGNETIC BUBBLE MEMORY

BACKGROUND OF THE INVENTION

This invention relates to bubble memories, and more particularly to methods and apparatus for dealing with defective minor loops in the memories. Perhaps the most popular architecture for bubble memories is that in which bubbles are stored in a plurality of minor loops. A serial-parallel bubble propagation path is used to transfer bubbles into the loops, and a parallel-serial bubble propagation path is used to transfer from the loops.

However, due to a variety of causes, some of the loops develop defects during their fabrication. For example, the defects may be due to flaws in the garnet film, which resists bubble propagation. They may also be due to photolithography tolerances, or due to dust and other impurities which enter the memory during fabrication. As a result, some small percentage of the loops, such as less than 5 percent, typically do not work.

To overcome this problem, bubble memories are fabricated with extra minor loops. Then all bad loops, and any good loops in excess of a designed number, simply are not used. Suppose for example, that a bubble memory chip was designed to have 256 fault free minor loops. To achieve this the memory would be built with some larger number of minor loops, such as 270. Then in most cases, at least 256 loops would be fault free.

The problem then becomes one of devising a method or apparatus for bypassing the defective loops as information is written into and read from the memory. Suppose in the preceding example, loops 10 and 100 were defective. Under those conditions, no data could be written into the memory on the 10th and 100th clocking pulses out of every 270 clocking pulses. Similarly, during a read operation, the 10th and 100th bits of information out of every 270 bits of information that are read from the memory must be ignored.

Such control functions in the past have always required external control circuitry. One common prior art control circuitry includes a read only memory (ROM) that is programmed to indicate which of the loops are defective. Address counters simultaneously address both the ROM and the bubble memory. And when the ROM output indicates that the bubble memory location being addressed is defective, corrective action is taken.

One problem with the above prior art solution of handling defective loops, is that the added control circuitry increases the cost of the bubble memory system. Further, it increases the complexity of the design. Also, the bubble memory chips are not interchangable. Thus, whenever a bubble memoy chip goes bad (due to aging, overheating, etc.) both the bubble chip and the ROM chip must be replaced.

In addition, the operating speed of the memory is slower than it would be if the defects were transparent to the user. Consider again, the above described example that had 270 total loops of which only 256 loops were guaranteed to be non-defective. In that memory, a total of 270 revolutions of an external magnetic field are required to load one bubble into 256 minor loops. Conversely, if the defective loops were transparent to the user, a total of only 256 rotations of the magnetic field would be required to load one bubble into each of the loops.

Accordingly, it is one object of the invention to provide an improved bubble memory.

Another object of the invention is to provide a bubble memory having defective minor loops that require no external control circuitry for their compensation.

Another object of the invention is to provide bubble memory chips that are interchangeable.

Still another object of the invention is to provide bubble memory chips having improved data transfer time.

SUMMARY OF THE INVENTION

These and other objects are accomplished in accordance with the invention by a bubble memory that includes a plurality of minor loops for storing bubbles in parallel therein, a serial-parallel input propagation path for propagating bubbles to the minor loops, and a parallel-serial output propagation path for reading bubbles from the minor loops. The serial portion of both the serial-parallel path and of the parallel-serial path consists of a predetermined number of pairs of single distance propagation elements spaced between each of the parallel inputs and parallel outputs. Also, a shorting bar lies between each of these pairs of single distance propagation elements.

The shorting bar operates to convert each of the pairs into one double distance propagation element. After it is determined which of the minor loops are defective the shorting bars are selectively destroyed. This converts the corresponding double distance propagation elements into a pair of single distance propagation elements. As a result, the number of magnetic field rotations that are required to propagate a bubble between two good adjacent loops is the same as a number of field rotations required to propagate a bubble between two spaced apart good loops having one defective loop lying therebetween.

Preferably, a laser beam is used to selectively destroy the shorting bars. The beam energy and duration of application may be chosen to vaporize a portion of the shorting bar; or alternatively, the beam energy and duration of application may be chosen to merely degrade the magnetic bubble propagating characteristics of the shorting bar. In the latter case, the shorting bar acts as a barrier to the propagating bubbles.

DESCRIPTION OF THE DRAWINGS

Various preferred embodiments of the invention will best be understood by reference to the Detailed Description in conjunction with the accompanying drawings wherein;

FIG. 2 is a greatly enlarged top view of a portion of the serial-parallel bubble propagation path in the memory of FIG. 1.

FIG. 3 illustrates the position of a bubble at various time instants as it moves along the serial-parallel propagation path of FIG. 2.

FIG. 4 correlates the position of a rotating magnetic field with the position of the bubble in FIG. 3.

FIG. 5 is a greatly enlarged top view of a portion of the parallel-serial bubble propagation path in the memory of FIG. 1.

FIG. 6 illustrates the position of two bubbles at various time instants as they move along the parallel-serial path of FIG. 5.

FIG. 7 correlates the position of a rotating magnetic field with the position of the bubbles in FIG. 6.

DETAILED DESCRIPTION

Figure 1:
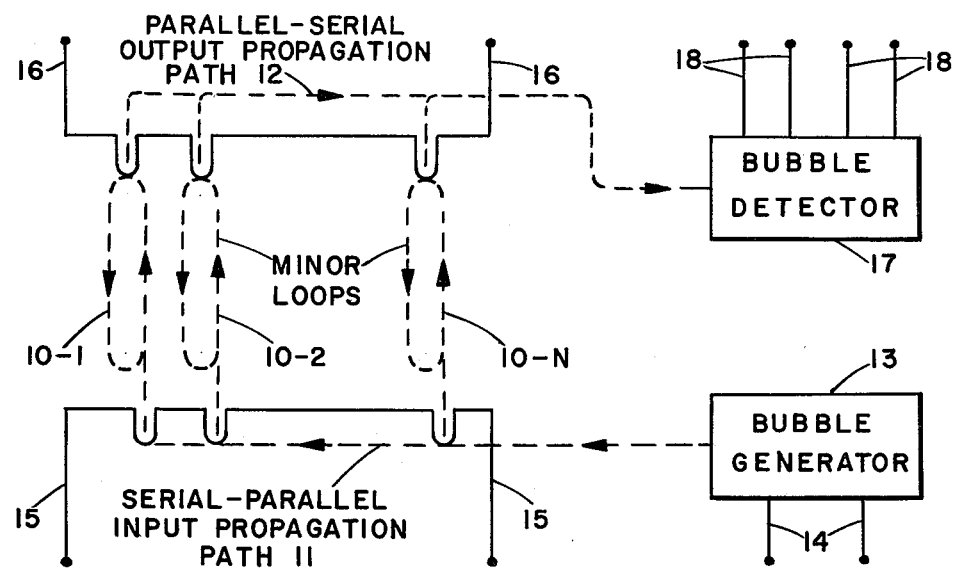
FIG. 1 is a schematic circuit diagram of a bubble memory constructed according to the invention.

Reference should now be made to FIG. 1 where a bubble memory constructed according to the invention is illustrated in schematic fashion. This memory includes a plurality of minor loops 10-1, 10-2, ... 10-N. Magnetic bubbles are propagated in these loops in the direction indicated by the arrows in response to a rotating magnetic field.

Also, included in the memory is a serial-parallel input propagation path 11, and a parallel-serial output propagation path 12. Paths 11 and 12 respectively provide a means for inputting bubbles into the minor loops and outputting bubbles from the loops.

In operation, bubbles are generated in a serial fashion on path 11 by a bubble generator 13. The generator produces the bubbles in response to the application of external signals on a pair of bubble generator control lines 14.

As is conventional in bubble memories having parallel minor loops connected to serial-parallel input and parallel-serial output propagation paths, the data stream produced by the bubble generator has an idle or unused bit position between each information bit position. The use of such an idle bit position is discussed in U.S. Pat. No. 3,909,810. The rotating magnetic field propagates the bubbles along the serial portion of path 11 until they respectively align with the various parallel inputs to the minor loops. Subsequently, in response to an external signal applied to a transfer-in control line 15, the bubbles propagate along the parallel inputs to the minor loops. Due to various processing limitations, some of the loops 10-1 through 10-N will be defective. Accordingly, current practice is to generate data in preprogrammed cycles such that the data on input propagation path 11 will align with only the non-defective minor loops. The other positions, which contain no data, will fall between these loops as the instant data is transferred from the input path to the minor loops.

Similarly, in response to the application of an external signal to a transfer-out control line 16, one bubble from each of the minor loops is made to propagate through the parallel portion of path 12. These bubbles are subsequently merged in a serial fashion. Then they are serially propagated to a bubble detector 17 which operates to generate signals respresentative of the bubbles on output lines 18.

In the present invention, the serial-parallel input propagation path 11 and the parallel-serial output propagation path 12 have a unique design which allows defects in the minor loops to be transparent to the memory user. Basically, this unique design allows defective minor loops to be bypassed. The bypassing occurs in such a way that the number of magnetic field rotations that are required to propagate a bubble between two non-defective adjacent loops is the same as the number of field rotations that are required to propagate a bubble between two non-defective loops which have one defective loop lying therebetween.

The selection of which minor loops are to be bypassed is programmable; and the programming occurs near the end of the memory's fabrication process. Thus, in accordance with the invention, the memory is tested near the end of its fabrication process to determine which of the minor loops are defective. And subsequently a programming step is performed which causes all defective loops to be bypassed.

The structure and operation of one preferred embodiment of serial-parallel input propagation path 11 will now be described in conjunction with FIGS. 2, 3, and 4. In FIG. 2, reference numerals 30–41 indicate the serial portion of propagation path 11, whereas reference numerals 42 through 47 indicate the parallel portion of path 11.

As FIG. 2 illustrates, the serial parallel propagation path is comprised of three types of propagation elements. These include chevron shaped propagation elements 30, 31, 32, 35, 38, 41, 42, 43, 44, 45, 46, and 47; U-shaped propagation elements 33, 36, and 39; and rectangular shaped shorting bars 34, 37, and 40.

It is to be understood however, that the principles of the invention may be applied to a wide variety of propagation element and shorting bar shapes.

Both the chevron shaped propagation elements and U-shaped propagation elements are herein referred to as single distance propagation elements. That is, with the shorting bars removed, one rotation of a magnetic field causes bubbles to propagate along these elements by a predetermined single distance. This distance is indicated in FIG. 2 via reference numeral 48.

Now in the FIG. 2 embodiment of the invention, one pair of the single distance propagation elements lie between each of the parallel inputs to the minor loops. And associated with each of these pairs of single distance propagation elements are respective shorting elements 34, 37, and 40. The combination of a pair of single distance propagation elements with one shorting element is herein referred to as a double-distance propagation element.

These double distance propagation elements operate to propagate a bubble twice as far as the individual single distance propagation elements in one rotation of a magnetic field. Reference numeral 49 indicates the distance that a bubble travels on a double distance propagation element in response to one rotation of the field.

Also in accordance with the invention, shorting elements 34, 37, and 40 are constructed such that they are selectively destructable. Preferably, they are destructable by application of a laser beam. The power level and time duration of the laser beam may be chosen to vaporize a portion of the shorting element. Alternatively, it may be chosen to only degrade the magnetic characteristics of the shorting element.

By destroying the shorting elements, the double distance propagation elements are converted into pairs of single distance propagation elements. And thus, by changing each of the double distance propagation elements that lie between fault free minor loops into a pair of single distance propagation elements, no bubbles will be transferred to the defective minor loops.

Consider for example, the serial-parallel path of FIG. 3. The propagation elements 44 and 45 are assumed to lead to a defective minor loop whereas all other minor loops are assumed to have no defects. In order to inhibit bubbles from entering the defective loop, shorting elements 34 and 37 are left unchanged; while all the remaining shorting elements are destroyed. This includes shorting element 40 for example, and all those which follow it. In FIG. 3, reference numeral 50 indicates the destruction of element 40.

Next consider how serial-parallel propagation path 11 operates after the above descrived selective destruction of the shorting elements has occurred. The operation may be understood by reference to FIGS. 3 and 4. FIG. 4 shows the position of a rotating magnetic field as various time instants T1a, T1b . . . ; and FIG. 3 shows the position of a bubble corresponding to those same time instants.

In these Figures, time instants T1a, T1b, and T1c occur in one rotation of the field; time instants T2a, T2b, and T2c occur in another rotation of the field, etc. Inspection of FIG. 3 shows that only three complete rotations of the magnetic field are required to move a bubble from a position on propagation element 32 to a corresponding position on propagation element 39. This is because two double distance propagation elements lie therebetween. As a result, the defective minor loop is bypassed.

In comparison, if shorting element 34 had been selectively destroyed, then three rotations of the magnetic field would have caused the bubble from element 32 to only propagate to element 36. This is because two single distance propagation elements would have lied therebetween. A similar bubble movement occurs over single distance propagation elements 39 and 41. See for example, the illustrated movement of bubble over these elements, during the interval between time instants T4b and T6b.

Next referring to FIGS. 5, 6, and 7 a preferred embodiment for output propagation path 12 and the operation thereof will be described. In FIG. 5, reference numerals 60–71 indicate the serial portion of propagation path 12; whereas reference numerals 72–77 represent the parallel portion of path 12. Basically, propagation path 12 is comprised of two types of elements. These include chevron shaped single distance propagation elements 60, 62, 63, 65, 66, 68, 69, 71, 72, 73, 74, 75, 76, 77; and chevron shaped shorting elements 61, 64, 67, and 70.

In the serial portion of propagation path 12 one pair of single distance propagation elements lie between each of the parallel outputs from the minor loops. Also, each pair of single distance propagation elements are intercoupled by shorting element to form a corresponding double distance propagation element. In FIG. 5, reference numeral 48 again indicates the distance that a bubble travels on a single distance propagation element in response to one rotation of the magnetic field; whereas reference numeral 49 indicates the distance that a bubble travels on a double distance propagation element.

By selectively destroying shorting elements 64, 67, and 70 the double distance propagation elements may be converted into respective pairs of single distance propagation elements. And this selective conversion allows defective minor loops to be bypassed. Specifically, defective loops are bypassed by changing each of the double distance propagation elements that lie between fault free minor loops into a pair of single distance propagation elements.

FIGS. 6 and 7 illustrate this bypass mechanism in greater detail. Specifically, in FIG. 7, the position of a rotating magnetic field at various time instants T10a, T10b, . . . is given; whereas in FIG. 6, the positions of two magnetic bubbles at time instants corresponding to those of FIG. 7 are illustrated. To distinguish these two bubbles from each other, one of them is cross hatched while the other is not.

Also in FIG. 6, it is assumed that the minor loop which connects to propagation element 74 and 75 is defective. Thus, it is desired to propagate bubbles past this defective loop in the serial portion of path 12 with only two rotations of the magnetic field. This is performed by leaving shorting elements 64 and 67 unchanged. Conversely, it is desired to propagate bubbles between adjacent good loops such as between chevron 77 and 71, in two rotations of the magnetic field. To accomplish that, shorting elements between the good loops such as element 70, are selectively destroyed. Reference numeral 78 indicates the destruction of shorting bar 70.

Consider now the path of the two bubbles in FIG. 6 between time instants T11b and T13b. Following the path of the non-crosshatched bubble, it is seen that after only two revolutions of the magnetic field that bubble has propagated from element 73 past the defective minor loop to the end of propagation element 68. On the other hand, the cross hatch bubble has only propagated from element 77 to the end of propagation element 71. As a result, the two bubbles are separated by only two rotations of the magnetic field; and thus, the defective minor loop is transparent to the user.

Figure 8:
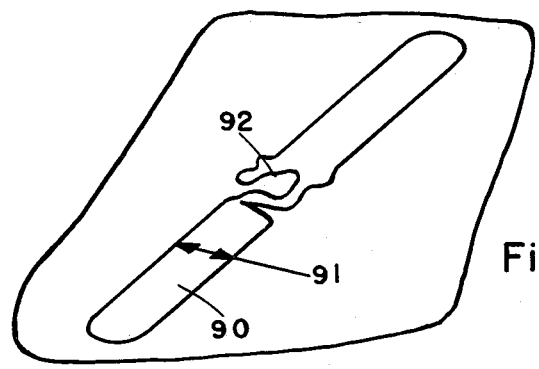
FIG. 8 is a microphotograph illustrating the destruction of a shorting bar in the propagation paths of FIGS. 2 and 5.

Referring now to FIG. 8, there is illustrated a microphotograph of one of the shorting elements 90 after it has been selectively destroyed by a laser beam. Shorting element 90 is comprised of the permalloy. It has a width 91 of approximately 3 micrometers, and a thickness of approximately 4,300 angstroms. Lying on top of this shorting element and the entire memory chip is an insulating layer of $S_fO_2$ having a thickness of approximately 1,500 angstroms.

As FIG. 8 illustrates, the laser beam was applied to shorting element 90 at point 92. The particular instrument used was a pulsed Xenon laser. The laser beam had a diameter of approximately 5 micrometers, a wavelength of 5,400 angstroms and a power level of approximately 180 watts. The beam was applied for 300 nanoseconds. This was sufficient to vaporize both the insulating layer at point 92 and the shorting element lying thereunder. Alternatively, a YAG laser such as the Quantrad 1080 by Quantrad Corporation of El Segundo Calif., may be used.

As an alternative, the shorting elements can be selectively destroyed in accordance with the invention without actually vaporizing them. All that is necessary is to heat the shorting elements to a temperature sufficient to substantially degrade their magnetic properties. Then they will act as barriers over which the bubbles will not propagate.

A set of curves correlating the magnetic characteristics of various permalloys as a function of temperature may be found in the publications entitled "Magnetic Thin Films", by R. F. Soohoo, Harper and Row; New York, Evanston and London, 1965 at page 85, Figure 6.6 and "Properties of Electro Deposits, their Measurement and Significance" Electro Chemical Society, Princeton, N.J., 1975 at Chapter 23, page 425, Figure 16. Those temperatures may be achieved by appropriately choosing the power level and time of duration of the applied laser beam. Optimal beam energy and time of application will of course, depend upon the thickness of the insulating layer, the thickness of the shorting bar, and the materials from which they are fabricated.

Figure 9:
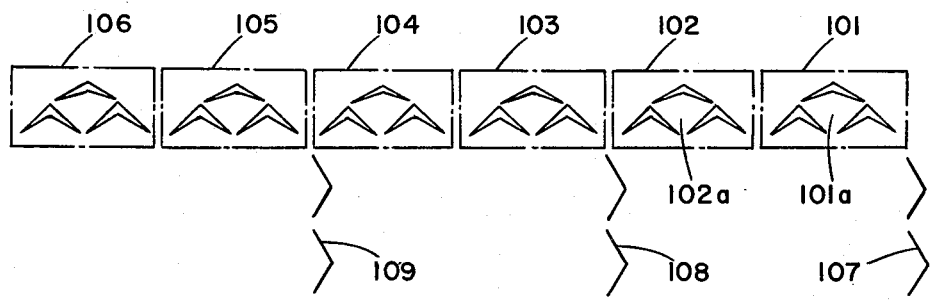
FIG. 9 is a schematic diagram of an alternative embodiment for the parallel-serial propagation path in the memory of FIG. 1.

All of the above described embodiments of the invention have included only one double distance propagation element between the parallel outputs and parallel inputs to the minor loops. However, alternative embodiments may also be constructed by utilizing any number of double distance propagation elements between these inputs and outputs. FIG. 9 illustrated for example, a serial-parallel propagation path similar to that of FIG. 5, but with two double distance propagation elements lying between the parallel outputs from the minor loops. In that Figure, reference numeral 101 through 106 indicate the double distance propagation elements.

Programming of the FIG. 9 embodiment occurs as follows. If two adjacent minor loops have no defects, then all of the shorting bars lying therebetween are selectively destroyed. Thus for example, if the minor loops connected to parallel outputs 107 and 108 have no defects, then shorting bars 101a and 102a would be destroyed. Conversely, if the minor loop connected to output 109 was defective, then the shorting bars within double distance propagation elements 103, 104, 105, and 106 would be left unchanged.

Various preferred embodiments of the invention have now been described in detail. In addition, many changes and modifications may be made thereto without departing from the nature and spirit of the invention. Therefore, it is to be understood that the invention is not limited to said details but is defined by the appended claims.

I claim:

1. A fault transparent magnetic bubble memory comprised of;
   a plurality of minor loop means for propagating bubbles in parallel therein;
   serial-parallel input means for propagating bubbles to said minor loops wherein the serial portion of said serial-parallel means consists of a predetermined number of pairs of single-distance propagation means between each of the parallel inputs;
   parallel-serial output means for propagating bubbles from said minor loops wherein the serial portion of said parallel-serial means consists of a predetermined number of pairs of single-distance propagation means between each of the parallel outputs; and
   shorting means lying between each of said pairs of single-distance propagation means for converting said pairs into double-distance propagation means, said shorting means also being selectively destructable.

2. A memory according to claim 1 wherein said predetermined number of pairs of single-distance propagation means between said parallel input is one, and said predetermined number pairs of single-distance propagation means between said parallel outputs is also one.

3. A memory according to claim 1 wherein each of said shorting means is destructable by application of a laser beam thereto.

4. A memory according to claim 1 wherein each pair of said single-distance propagation means in said parallel-serial means consists of a pair of chevron shaped permalloy regions.

5. A memory according to claim 1 wherein each pair of said single-distance propagation means in said serial-parallel means consists of one chevron shaped permalloy region and one U-shaped permalloy region.

6. A method of fabricating fault transparent magnetic bubble memories including the steps of;
   providing a plurality of minor loops for propagating bubbles in parallel therein;
   providing a serial-parallel input propagation path to said minor loops wherein the serial portion of said serial-parallel path consists of a predetermined number of double-distance propagation elements between each of the parallel inputs;
   providing a parallel-serial output propagation path from said minor loops wherein the serial portion of said parallel-serial path consists of a predetermined number of double-distance propagation elements between each of the parallel outputs; and
   changing each of the double-distance propagation elements, that lie between fault free minor loops, into a pair of single-distance propagation elements.

7. A method according to claim 6 wherein said predetermined number of double-distance propagation elements between said parallel inputs is one, and said predetermined number of double-distance propagation elements between said parallel outputs is also one.

8. A method according to claim 6 including the step of forming each of said double-distance propagation elements from a pair of single-distance propagation elements with a selectively destructable shorting element lying therebetween to allow bubbles to propagate over said pair in only one revolution of a rotating magnetic field.

9. A method according to claim 8 wherein said double-distance propagation elements between said fault free minor loops are changed to a pair of single-distance propagation elements by applying a laser beam to the corresponding shorting elements.

* * * * *